United States Patent [19]

Lamoureux

[11] 3,969,715

[45] July 13, 1976

[54] GAS PANEL WITH IMPROVED WRITE CIRCUIT AND OPERATION

[75] Inventor: William R. Lamoureux, Kingston, N.Y.

[73] Assignee: IBM Corporation, Armonk, N.Y.

[22] Filed: June 1, 1973

[21] Appl. No.: 365,922

[52] U.S. Cl. ............... 340/324 M; 315/169 R; 340/166 EL; 340/173 PL
[51] Int. Cl.² ............................................. H01J 17/48
[58] Field of Search ............... 340/324 M, 173 PL; 315/169 R, 169 TV; 178/7.3 D

[56] References Cited
UNITED STATES PATENTS

| | | | |
|---|---|---|---|
| 3,618,071 | 11/1971 | Johnson et al. | 340/324 M |
| 3,750,159 | 7/1973 | Wojcik | 340/324 M |
| 3,801,861 | 4/1974 | Petty et al. | 315/169 R |
| 3,803,450 | 4/1974 | Trogdon | 315/169 R |

*Primary Examiner*—David L. Trafton
*Attorney, Agent, or Firm*—W. S. Robertson

[57] ABSTRACT

An improved write waveform is provided for a gas panel of the type in which light emitting cells are formed in an ionizable medium at the cross points of a set of horizontally and vertically extending insulated wires. A write pulse of high amplitude is followed by an opposite polarity pulse of an amplitude and width to produce cell wall charge storage from the ionization that accompanies the fall of the high amplitude write pulse. The invention also provides a method and circuit for reading the state of a cell by applying the high amplitude write pulse to a cell and detecting the difference between the smaller current that occurs at the leading edge of the write pulse for a previously written cell and the larger current for an erased cell.

6 Claims, 13 Drawing Figures

FIG. 3
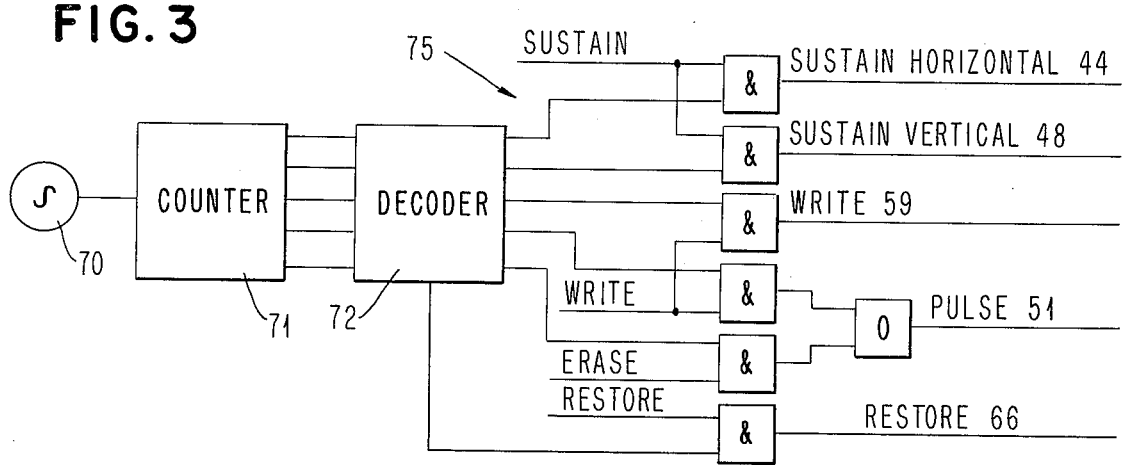
FIG. 4
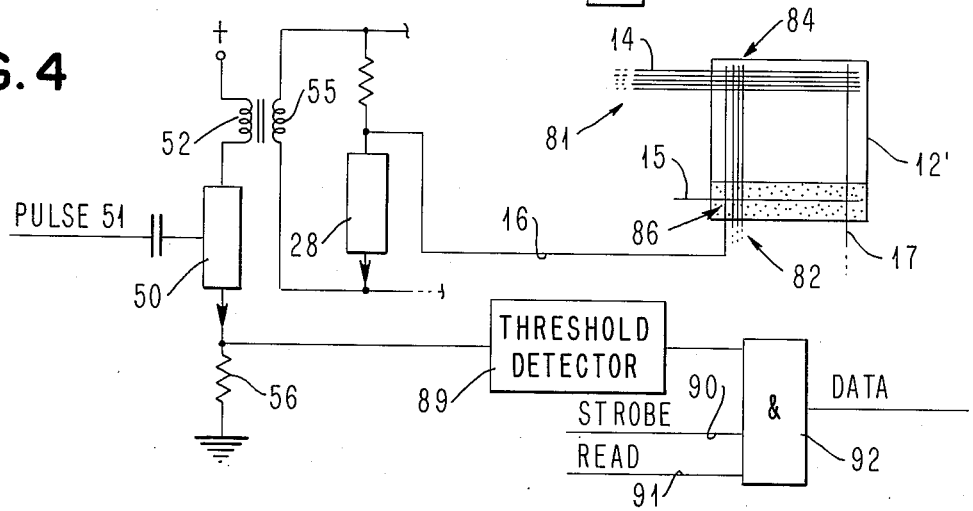
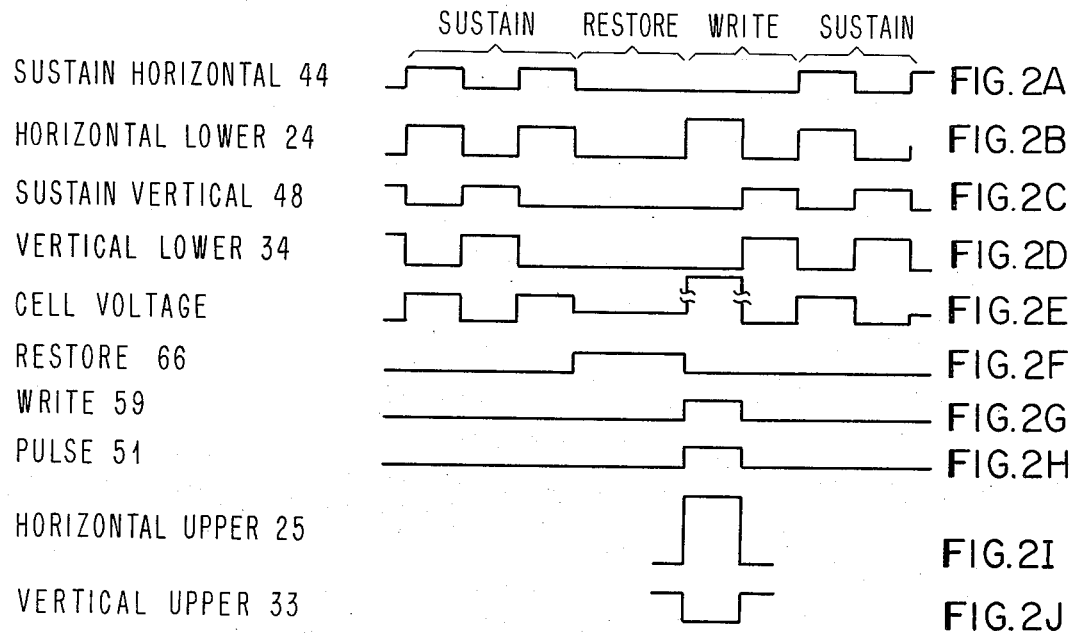

GAS PANEL WITH IMPROVED WRITE CIRCUIT AND OPERATION

RELATED APPLICATIONS

Application Ser. No. 268,219 of T. N. Criscimagna and A. O. Piston for "Method And Apparatus For Gas Display Panel" discloses a gas panel and provides background information that is helpful in understanding the preferred embodiment of this invention.

INTRODUCTION

Gas panels of the type to which this invention relates have two glass plates that are spaced apart by a seal to contain an ionizable medium. A set of horizontally extending insulated conductors are located on one glass plate and a set of vertically extending conductors are located on the other plate. When a suitable voltage is applied between one horizontal conductor and one vertical conductor, ionization occurs at the crossover point of the two conductors and light is emitted. The crossover points are called cells, and a display pattern is formed by ionizing selected cells. The operation of initially ionizing a cell is called writing. The operation of removing the wall charges from a previously written cell is called erasing. One object of this invention is to provide an improved waveform for a write operation.

As a result of the ionization that occurs during writing, positive and negative charges accumulate on opposite insulating walls of the cell. The voltage of this charge opposes the voltage applied between the vertical conductor and the horizontal conductor so that the sum of these voltages quickly falls below the voltage required for ionization and light is emitted from the cell for only a brief instant. The write voltage waveform is maintained for a longer interval so that a substantial charge is stored on the cell walls. After the write operation, periodic light output of the cell is sustained by an alternating polarity voltage that is called a sustain voltage. The sustain pulse following the write operation is opposite in polarity to the write pulse and thus is of the same polarity as the charge that was stored on the cell walls by the write operation. Since the cell ionizes at a voltage that is the sum of the applied voltage and the voltage of the stored charge, a previously written cell ionizes at an applied sustain voltage that is less than the write voltage. The sustain voltage is applied simultaneously to all cells and the previously written cells ionize and accumulate charge for the next sustain operation but the previously erased cells remain un-ionized. An object of this invention is to provide a new circuit and write operation that simplifies the amplitude relationship that must be maintained between the sustain voltage and the write voltage.

SUMMARY OF THE INVENTION

As has already been explained, the sustain voltage must be high enough to sustain a previously written cell but not high enough to produce an unintended write operation in a previously erased cell. The write pulse is formed by the difference between a pulse applied to the selected horizontal conductor and a pulse applied to the selected vertical conductor. These voltage amplitudes are called half select voltages, and cells along a row or a column conductor that receive a half select voltage are said to be half selected. The write half select voltage must be high enough to produce a full select voltage to ionize the selected cell, but it must be low enough not to produce an unintended write operation on any other half selected cells. The voltage difference between the minimum voltage required for sustain and the minimum write voltage is called a margin. When the margin is narrow, all of the cells of a display will operate properly only if the manufacturing processes are very accurate. If the margins are wide, the display will operate more reliably and will be less costly to manufacture.

It would be desirable to use a write pulse of the maximum amplitude that would not produce an unintended write operation in half selected cells. However, it has been found that when a high amplitude write pulse is used, the cell may be unintentionally erased on the trailing edge of the write pulse. Apparently, the voltage stored on the cell walls is by itself high enough to produce ionization, during the write operation; however; the applied write voltage opposes the voltage of the stored charge and permits only the brief initial ionization. With the fall of the write pulse, ionization may occur and it permits the wall charges to recombine in an unintended erase operation.

According to this invention, the write pulse has a high amplitude that is limited only by the requirement that an unintended write operation does not take place in half selected cells. The trailing edge of the write pulse falls rapidly from a point above the level where ionization might occur to a sustain voltage level of the opposite polarity and the sustain level is maintained for a sufficient time to store the charges on the cell wall. There is a delay between the application of an ionizing voltage level and the resulting ionization, and the ionization associated with the fall of the write pulse occurs in the presence of the sustain voltage. This waveform improves the voltage margins and avoids the possibility of an unintended erase at the end of a write pulse.

The high amplitude write pulse also improves the operation of setting a new display pattern into the gas panel. As will be explained in the description of the specific embodiment of this invention, the circuits for selecting a vertical or horizontal conductor for a write or erase operation are relatively low voltage circuits and are connected to electrically float on the relatively high voltage of the sustain waveform. To change the status of the selection circuits, the sustain pulse is interrupted for a few cycles (or for a fraction of one cycle) and the selection circuits are restored to ground potential. With a conventional low amplitude write pulse, the write pulse initiates the storage of charge on the cell walls and the charge level increases in response to the next several sustain pulses to a level that permits the sustain pulse to be interrupted for setting the selection switches. The high amplitude write pulse of this invention initially establishes a high charge level and the sustain pulse can be interrupted shortly after the write operation.

Relatively high current levels occur in the selection circuits during this high amplitude write operation, and this effect can be used to distinguish between a previously written cell and a previously erased cell. A write pulse preferably follows a sustain pulse of the same polarity, and in a previously written cell, ionization occurs in response to the sustain pulse and consequently, the leading edge of the write pulse produces little or no ionization and the associated write current is small. On a previously erased cell, the sustain operation preceding the write operation does not produce ionization and the leading edge of the write pulse produces a high degree of ionization and relatively high currents in the selection circuits. Thus, a previously written cell is recognizable by a low amplitude selection current at the leading edge of the write pulse and a previously erased cell is recognizable by higher current levels in the selection circuit on the leading edge of the write pulse. According to this invention, the display has an unviewed area where cells represent ordinary binary data instead of a display pattern. A code storing position of a few cells is associated with each character display position which has many more cells. As a character is written into the visible portion of the panel, an identifying code is written into the corresponding code storing position. To read the character stored in the viewable portion of the display, a write operation is performed on each cell of the corresponding code storing position and the currents in the write selection circuits are sensed to detect whether the cell stored a binary 1 or 0.

Other objects, advantages, and features of the invention will be apparent from the following description of a preferred embodiment of the invention.

THE DRAWING

FIGS. 2A through 2J show waveforms that illustrate the operation of the circuit of FIG. 1.

FIG. 3 is a schematic diagram of a circuit for producing the waveforms of FIG. 2.

FIG. 4 is a schematic of a circuit and related components of a gas panel in which the previously written or erased state of a cell is sensed as a function of the amplitude of the write current.

Figure 1:
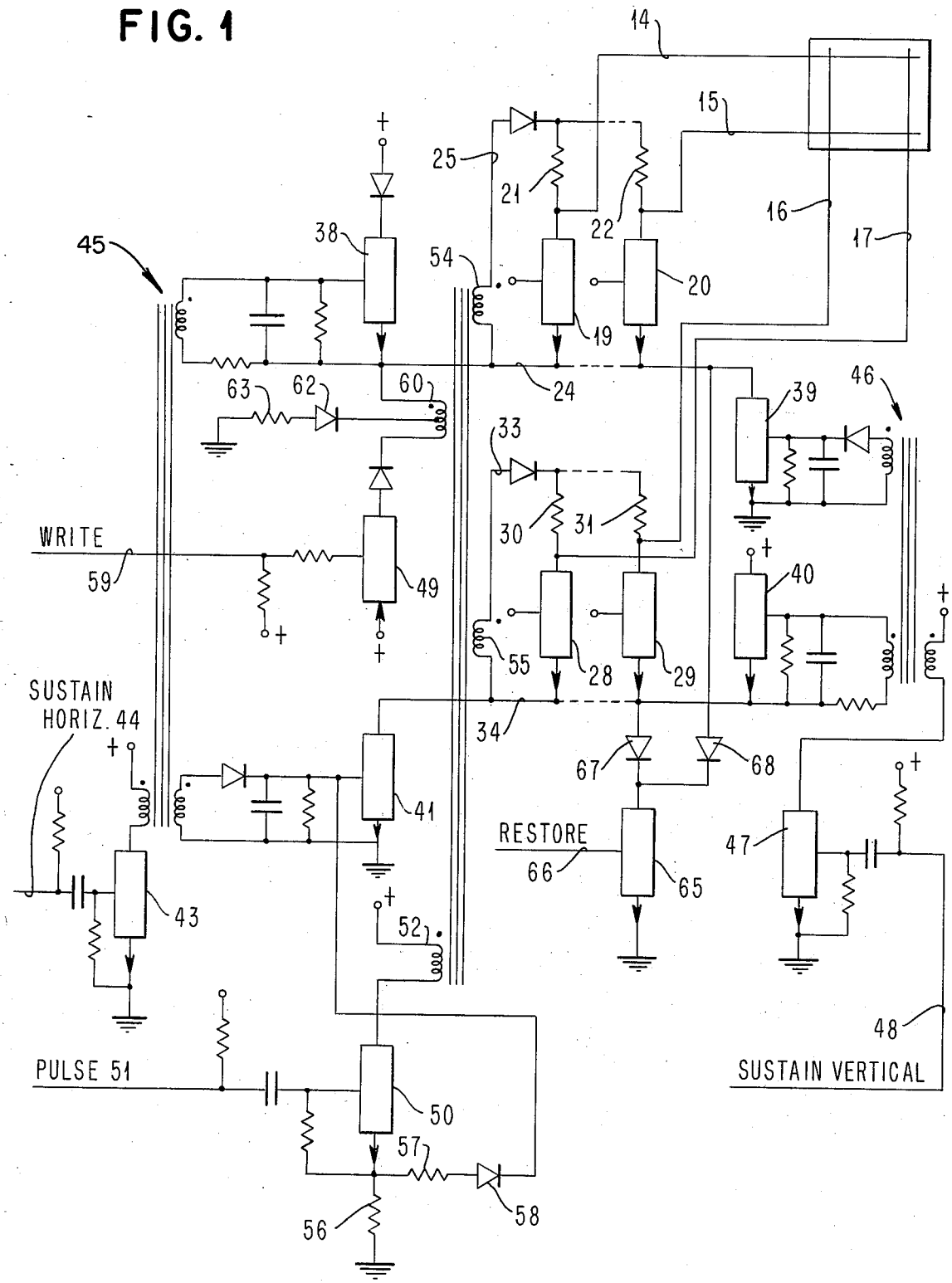
FIG. 1 shows the sustain and write circuits of this invention and related components of a gas panel.

The Gas Panel Circuit Of FIGS. 1 and 2

The Sustain and Selection Components And Operation

A gas panel 12 has representative horizontal conductors 14, 15 and representative vertical conductors 16 and 17. Transistors 19 and 20 and associated resistors 21, 22 respond to selection signals at their base terminals to connect the associated horizontal conductors 14, 15 to a lower horizontal sustain line 24 or an upper horizontal sustain line 25. Transistors 28, 29 and associated resistors 30, 31 similarly connect vertical conductors 16, 17 to an upper vertical sustain line 33 or to a lower vertical sustain line 34. Except during write and erase operations, transistors 19, 20, 28, 29 are turned on and the horizontal conductors have the potential of line 24 and the vertical conductors have the potential of line 34. During write and erase operations, selected transistors are turned off and the corresponding conductors receive the voltage of an upper sustain line 25 or 33.

Transistors 38, 39 cooperate to switch horizontal lower sustain line 24 between a positive potential point and ground for a sustain operation. Transistors 40, 41 similarly switch vertical lower sustain line 34 between a positive potential point and ground for the sustain operation. As FIGS. 2B and 2D show, transistors 38, 41 turn on together to raise line 24 and lower line 34 and transistors 39, 40 turn on together (when transistors 38, 41 are turned off) to lower line 24 and raise line 34. A transistor 43 receives the sustain horizontal waveform on line 44 shown in FIG. 2A, and controls transistors 38, 41 through a transformer 45. Similarly, a transformer 46 couples a transistor 47 to control transistors 39, 40 in response to the waveform sustain vertical on a line 48 shown in FIG. 2C. Thus, the components of the circuit that have been described so far respond to the waveform sustain horizontal and the complementary waveform sustain vertical to produce the waveform horizontal lower on all the horizontal conductors and the waveform vertical lower on all vertical conductors. As FIG. 2E shows, the voltage at the horizontal conductor of a cell with respect to the vertical conductor of a cell varies in polarity between positive and negative values that are appropriate in amplitude and in duration to sustain periodic ionization of each previously written cell but not to produce an unintended ionization in any previously erased cell.

THE WRITE AND ERASE CIRCUIT COMPONENTS

As has already been explained, a write or an erase operation is performed by turning off selected transistors 19, 20 28, 29 and applying appropriate voltages to the horizontal upper line 25 and the vertical upper line 33. A transformer 48 and transistors 49, 50 establish the potential between lines 24, 25 and lines 33, 34. Transistor 50 turns on in response to a signal Pulse on a line 51 to energize a transformer primary winding 52 (see FIG. 2H). A transformer secondary winding 54 is connected to establish the write or erase potential between lines 24 and 25 and a secondary winding 55 is connected to establish the write or erase potential between lines 33 and 34. A network of resistors 56, 57 and a diode 58 connects transistor 50 to turn on transistor 41 in response to the signal Pulse on line 51. The operation of these components brings lower vertical sustain line 34 to ground potential during a write or erase operation. Transistor 49 cooperates with a secondary winding 60 to establish a selected potential on line 24 in response to a Write pulse on a line 59 (see FIGS. 2B and 2G). When transistor 49 is turned on for a write operation, it connects the lower end of winding 60 to a reference potential point. When transistor 49 is turned off for an erase operation, a diode 62 and a resistor 63 connect a selection portion of secondary winding 60 between line 24 and a reference potential point, ground. A transistor 65 responds to a pulse Restore on a line 66 to connect lower horizontal sustain line 24 and lower vertical sustain line 34 to ground for applying inputs to the base terminology of transistors 19, 20, 28, 29. (Diodes 67, 68 maintain isolation between lines 24, 34.)

THE WRITE OPERATION - FIGS. 2A THROUGH 2J

These figures show a write operation and preceding sustain operations (already described) and a restore operation. For the restore operation, the sustain horizontal signal on line 44 and the sustain vertical signal on line 48 are maintained at ground potential. This operation turns off transistors 38, 41 and maintains transistors 39, 40 off. The Restore signal on line 66 is raised to turn on transistor 65 and thereby bring horizontal lower line 24 and vertical lower line 34 to ground potential. While these lines are at ground, signals are applied to the circuits (not shown) that control selection transistors 19, 20, 28 and 29. For the write operation, the signal Write on line 59 is lowered to turn on transistor 49 and thereby connect secondary winding 60 between the reference potential point and horizontal lower line 24, and the signal Pulse on line 51 is raised to turn on transistor 50 and energize transformer primary winding 52. In this operation, the voltage across secondary winding 60 raises horizontal lower line 24 with respect to ground, (FIG. 2B) and the voltage across secondary winding 54 raises the horizontal upper line 25 with respect to horizontal lower line 24 (FIG. 2J). The voltage at the emitter terminal of transistor 50 rises to turn on transistor 41 to maintain lower vertical line 34 at ground (FIG. 2J); the voltage of secondary winding 55 raises the voltage on upper vertical line 33 (FIG. 2J).

The selection transistors 19, 20 are operated for horizontal conductor 14, 15 of a selected cell to receive the upper horizontal voltage of FIG. 2I and for all other horizontal conductors to receive the lower horizontal voltage of FIG. 2B. Selection transistors 28, 29 are operated for the vertical conductors 16, 17 of a selected cell to receive the voltage of lower vertical line 34 (ground potential) and for all other vertical conductors to receive the positive potential of upper vertical line 33. A selected cell receives the waveform of FIG. 2E. An unselected cell on the same row as a selected cell receives the difference between the positive potential of upper horizontal line 25 and the less positive potential of upper vertical line 33; (the voltage of line 33 inhibits the write operation in an unselected row). Similarly, an unselected cell in the same column as a selected cell receives the difference voltage between line 24 and line 34, and a cell that is unselected receives the difference voltage between lines 24, 33.

This portion of the write pulse is followed by a negative sustain pulse. Transistor 50 is turned off to produce zero voltage across secondary windings 54, 55 and transistor 47 is turned on to begin a negative sustain operation. Ionization occurs at a selected cell as a result of the fall of the write pulse. (Preferably, the amplitude of the write pulse is high enough that ionization would occur undesirably as an incident of the fall of the write pulse to zero potential.) With the waveform of FIG. 2E, ionization occurs after the voltage has reached the negative sustain voltage level. (There is a short time delay between the application of an ionizing voltage and the occurrence of the ionization.). Thus, ionization occurs in the presence of an applied potential that is sufficient to store charges on the cell walls.

From a more general standpoint, the amplitude of the write pulse of FIG. 2E is maintained sufficiently high to prevent the voltage of the stored charge from producing ionization and thereafter the voltage is changed to an opposite polarity of amplitude to produce a sustain operation, and at a transition rate for the ionization to occur during the application of the same voltage and not earlier such that an erase operation might occur while a low amplitude voltage is maintained across the cell. Thus, the write pulse may be dropped to a positive sustain level for a predetermined time and thereafter switched to the negative sustain level. The waveforms may be modified also to comprise the leading portion of a normal positive sustain pulse, a restore operation in the positive sustain pulse interval, the write pulse of this invention in the latter part of this sustain period, and a negative sustain pulse.

The actual values of the width and amplitudes of the waveforms will depend on the design of a particular gas panel and will be readily found by those skilled in the art. In one gas panel using this invention, the sustain voltage and the voltage of winding were each about 115 volts; the sustain pulses were about 4 microseconds wide, and the write pulse across windings 54, 55 was about 45 volts (and the voltage at line 25 to ground was 160 volts).

Thus, as the invention has been described so far, the display is provided with a high amplitude write pulse without an undesirable erase operation. The voltage margins of the panel are improved and improved charge storage occurs with the write operation so that fewer sustain operations are required before the next restore operation.

The Timing Circuit of FIG. 3

FIG. 3 shows a circuit for generating the waveforms of FIGS. 2A, C, F, G, and H. The period of the waveforms is subdivided into a number of equal time intervals and each pulse is enabled to rise or fall during a predetermined one of these time intervals. An oscillator 70 produces an output that established the duration of this interval. A counter 71 is advanced with each pulse from oscillator 70 and energizes a plurality of output lines in a counting sequence. In the example of the drawing, counter 71 has five output lines and thus produces a repeating sequence of 32 different binary count values during each period. A decoder circuit 72 receives the outputs of counter 71 and produces outputs during the intervals when a particular pulse is to be up. For example, the lowermost output of counter 71 is up for intervals 16 through 31 and thereby produces a symetrical square wave similar to FIGS. 2A and 2C; other logic functions of the counter outputs produce any selected pulse timing within intervals established by oscillator 70 and the period established by counter 71. A set of logic gates 75 respond to function signals and to outputs of decoder circuit 72 to produce the signals on lines 44, 48, 51 and 59 in FIG. 1.

Circuits of the general type illustrated in FIG. 3 are widely used for generating timing signals, and a variety of equivalent circuits for generating timing signals are well known. For example, a tapped delay line produces a sequence of pulses at its taps when a pulse is applied to one end of the delay line, and logic functions of the signal at the taps are combined to produce timing pulses; a control memory can be accessed repetitively for control signals that advance a particular operation and for address signals that identify the address of the next set of control signals in the memory. From a more general standpoint, the display includes conventional timing circuit means that is adapted to produce the particular waveforms of FIG. 2.

The Display of FIG. 4

The gas panel 12', transistor 50, and related components of FIG. 4 will be recognized from FIG. 2. The horizontal conductors 14, 15 and the vertical conductors 16, 17 form a pattern on the display in the same general way as already described for the apparatus of FIG. 1 except that the lower portion of the panel, including horizontal conductor 15 and a few adjacent horizontal conductors, is preferably made non-viewable, as indicated by speckling in FIG. 4. As is conventional, sets of horizontal conductors form rows of characters in the viewable area, and sets of vertical conductors form character locations within the rows. There may be physical spacing between these sets so that discrete character positions are formed on the panel. FIG. 4 shows a representative horizontal conductor set 81 and a representative vertical conductor set 82 that forms a character position 84.

The column conductors extend through both the viewable and the non-viewable areas of the panel. For each set of conductors in the viewable area, there is a single horizontal conductor (or a few horizontal conductors) in the non-viewable area that forms a multi bit code word location. For example, conductor 15 and conductor set 82 form a four bit code word position 86 that is associated with character position 84. When a character is written in a character position 84 in the viewable area, an identifying code is written in the code position 86 in the non-viewable area. A cell in the code word position may correspond to particular cells in the character location in a pattern that distinguishes one character from another, or the codes may be unrelated to the actual pattern in the display; in the first case, a code may be written in the code word location as the character is formed in the corresponding character location, and in either case the code may be written as a separate operation.

To electronically read the character in the visible area, a conventional write operation is performed at each cell of the corresponding code position. In a cell without stored charge, the high amplitude write pulse of this invention produces ionization and an accompanying current in the selection circuit that is detectably higher than the current of a sustain operation. This high current does not occur if the cell has been ionized by a preceding sustain pulse of the same polarity since the voltage of the stored charge opposes the write voltage. Thus, with the leading edge of the write pulse, a relatively high current occurs if the cell was previously erased and a relatively low current occurs if the cell was previously written. This current can be sensed at various circuit points such as across emitter resistor 56 of transistor 50. A threshold detector 89 is connected to produce an output in response to this amplitude but not in response to lower amplitudes. A signal Strobe on a line 90 identifies the time interval associated with the rise of the Write pulse in which this current may occur, a signal Read on a line 91 identifies that the read operation is to take place, and AND gate 92 responds to the coincidence of these signals to produce an output signifying that the cell was previously unwritten. If the cell was previously written, the circuit of FIG. 4 permits storing the identification of a displayed character in a readily available form.

From the description of preferred embodiments of this invention, those skilled in the art will recognize a variety of applications for the invention and appropriate modifications within the scope of the claims.

What is claimed is:

1. A gas panel of the type having light emitting cells formed at crossover points of two sets of conductors, comprising,
   means to apply between the conductors of said two sets a sustain waveform having positive and negative rectangular pulses,
   means to apply between the conductors of a selected cell a waveform of a predetermined polarity and of an amplitude and width to produce a write operation, and
   means for timing the occurrence of said write waveform with respect to said sustain waveform to produce a transition that is substantially continuous from said write waveform to a sustain voltage level in the opposite polarity over an interval that is short enough to prevent the cell from being erased as a result of the ionization associated with the transition.

2. The gas panel of claim 1 wherein the write waveform has an amplitude and width to charge the cell to a voltage that is high enough to produce ionization in the absence of the applied sustain waveform and write waveform and said gas panel further includes means to produce said transition from a level above the applied voltage level at which the cell ionizes from the stored charge.

3. The gas panel of claim 2 wherein said means to apply said write waveform includes means to produce a generally rectangular write pulse.

4. In a gas panel of the type having light emitting cells at crossover points of two sets of conductors, means to apply a sustain waveform across said two sets to produce ionization in any previously written cell at a predetermined point in time of said sustain waveform, and means to produce a write waveform of the polarity of a coincident sustain waveform at a time subsequent to said time of ionization by the sustain waveform, the improvement comprising,
   means to sense the ionization level associated with the leading edge of the write waveform and
   means responsive to the ionization level for signalling the previous written state of the cell when the ionization is below a predetermined level and to signal the previous erased state of a cell when the ionization is above said level.

5. The gas panel of claim 4 wherein said gas panel has a viewable area and a non-viewable area, a first dimension conductor in said non-viewable area for each character forming set of first dimension conductors in said viewable area, means for writing a character in said viewable area at the intersection of a set of first dimension conductors and a set of second dimension conductors and means for writing a character identifying binary code in the cells defined by the intersection of said set of second dimension conductors and said first dimension conductors, whereby sensing the ionization level of cells in the non-viewable area gives a binary code defining the corresponding character in the viewable area.

6. A method of operating a gas panel comprising,
   applying to each cell of the gas panel an alternating polarity rectangular waveform having a voltage to produce a sustain operation,
   applying to a cell of the gas panel selected for a write operation a waveform of the polarity of a coincident sustain voltage and of an amplitude to charge the cell to a voltage that is sufficient to ionize the cell in the absence of the applied sustain voltage and write operation waveform,
   maintaining the applied voltage at a level to oppose ionization from the voltage of the cell charge, and
   producing a transition that is substantially continuous from said level to a sustain voltage of the opposite polarity at a rate for the ionization accompanying the transition to occur in the presence of the sustain voltage.

* * * * *